(12) United States Patent
Tsai et al.

(10) Patent No.: US 12,593,722 B2
(45) Date of Patent: Mar. 31, 2026

(54) OPTICAL COUPLING DEVICE

(71) Applicants: Kabushiki Kaisha Toshiba, Tokyo (JP); Toshiba Electronic Devices & Storage Corporation, Tokyo (JP)

(72) Inventors: Yuning Tsai, Yokohama Kanagawa (JP); Yoshiko Takahashi, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 865 days.

(21) Appl. No.: 17/682,479

(22) Filed: Feb. 28, 2022

(65) Prior Publication Data

US 2023/0084755 A1      Mar. 16, 2023

(30) Foreign Application Priority Data

Sep. 16, 2021    (JP) ................................. 2021-150777

(51) Int. Cl.
| | |
|---|---|
| *H01L 25/16* | (2023.01) |
| *H01L 23/495* | (2006.01) |
| *H10F 55/20* | (2025.01) |
| *H10H 20/854* | (2025.01) |

(52) U.S. Cl.
CPC ...... *H01L 25/167* (2013.01); *H01L 23/49534* (2013.01); *H10F 55/207* (2025.01); *H10H 20/854* (2025.01)

(58) Field of Classification Search
None
See application file for complete search history.

(56) References Cited

U.S. PATENT DOCUMENTS

| | | | | |
|---|---|---|---|---|
| 5,198,479 A | * | 3/1993 | Shiobara | ............ C08G 59/4215 |
| | | | | 257/E33.059 |
| 5,523,137 A | * | 6/1996 | Sei | ......................... C09J 177/00 |
| | | | | 428/355 R |

(Continued)

FOREIGN PATENT DOCUMENTS

| | | |
|---|---|---|
| JP | 01-120875 A | 5/1989 |
| JP | H05-0251732 A | 9/1993 |

(Continued)

OTHER PUBLICATIONS

Translation for JP H08242017 Mitsui (Year: 1996).*

(Continued)

*Primary Examiner* — Jessica S Manno
*Assistant Examiner* — Christopher A. Schodde
(74) *Attorney, Agent, or Firm* — Knobbe, Martens, Olson & Bear, LLP

(57) ABSTRACT

An optical coupling device includes a leadframe, a light-emitter, a light-receiver, and first to fourth resins. The light-emitter is located on the leadframe. The first resin is located on the leadframe. The first resin includes first and second portions. The first portion surrounds the light-emitter. The second portion is positioned between the first portion and the light-emitter. A first thickness of the first portion is greater than a second thickness of the second portion. The second resin is located between the light-emitter and the light-receiver in the first direction and is light-transmissive. The third resin is located between the second resin and the light-receiver and is light-transmissive. The fourth resin houses the light-emitter, the light-receiver, and the first to third resins and is light-shielding.

10 Claims, 5 Drawing Sheets

(56)                  References Cited

U.S. PATENT DOCUMENTS

| | | | |
|---|---|---|---|
| 9,911,721 B2 | 3/2018 | Tonedachi | |
| 10,008,626 B2 | 6/2018 | Muranaka | |
| 10,475,949 B2 | 11/2019 | Kuraya | |
| 2009/0212316 A1* | 8/2009 | Braune | H10H 20/857 |
| | | | 257/E33.059 |
| 2014/0054614 A1 | 2/2014 | Tanaka et al. | |
| 2014/0159062 A1* | 6/2014 | Nomura | H01L 23/4952 |
| | | | 257/84 |
| 2015/0115255 A1* | 4/2015 | Sun | H10K 71/00 |
| | | | 438/46 |
| 2019/0341364 A1* | 11/2019 | Fathi | B32B 17/00 |
| 2022/0285465 A1* | 9/2022 | Kang | H10K 59/122 |

FOREIGN PATENT DOCUMENTS

| | | | | |
|---|---|---|---|---|
| JP | 06-5905 A | | | 1/1994 |
| JP | H08242017 A | * | | 9/1996 |
| JP | H11-0150291 A | | | 6/1999 |
| JP | 2000200923 A | * | | 7/2000 |
| JP | 2007-0129273 A | | | 5/2007 |
| JP | 2008192992 A | * | | 8/2008 |
| JP | 2013-0098381 A | | | 5/2013 |
| JP | 2014-041865 A | | | 3/2014 |
| JP | 2017-050411 A | | | 3/2017 |
| JP | 6416800 B2 | | | 10/2018 |
| JP | 6445947 B2 | | | 12/2018 |
| JP | 2019-012735 A | | | 1/2019 |

OTHER PUBLICATIONS

Translation for JP 2000200923 Mitsui (Year: 2000).*
Translation for JP 2008192992 Furutsu (Year: 2008).*
Office Action received in Japanese Application No. 2021-150777 dated May 30, 2024 in 8 pages.

* cited by examiner

OPTICAL COUPLING DEVICE

CROSS-REFERENCE TO RELATED APPLICATIONS

This application is based upon and claims the benefit of priority from Japanese Patent Application No. 2021-150777, filed on Sep. 16, 2021; the entire contents of which are incorporated herein by reference.

FIELD

Embodiments described herein relate generally to an optical coupling device.

BACKGROUND

There is an optical coupling device in which a light-emitting element located on a leadframe is protected by covering with a resin. It is desirable to increase the reliability of such an optical coupling device.

DETAILED DESCRIPTION

Figures 1A, 1B:
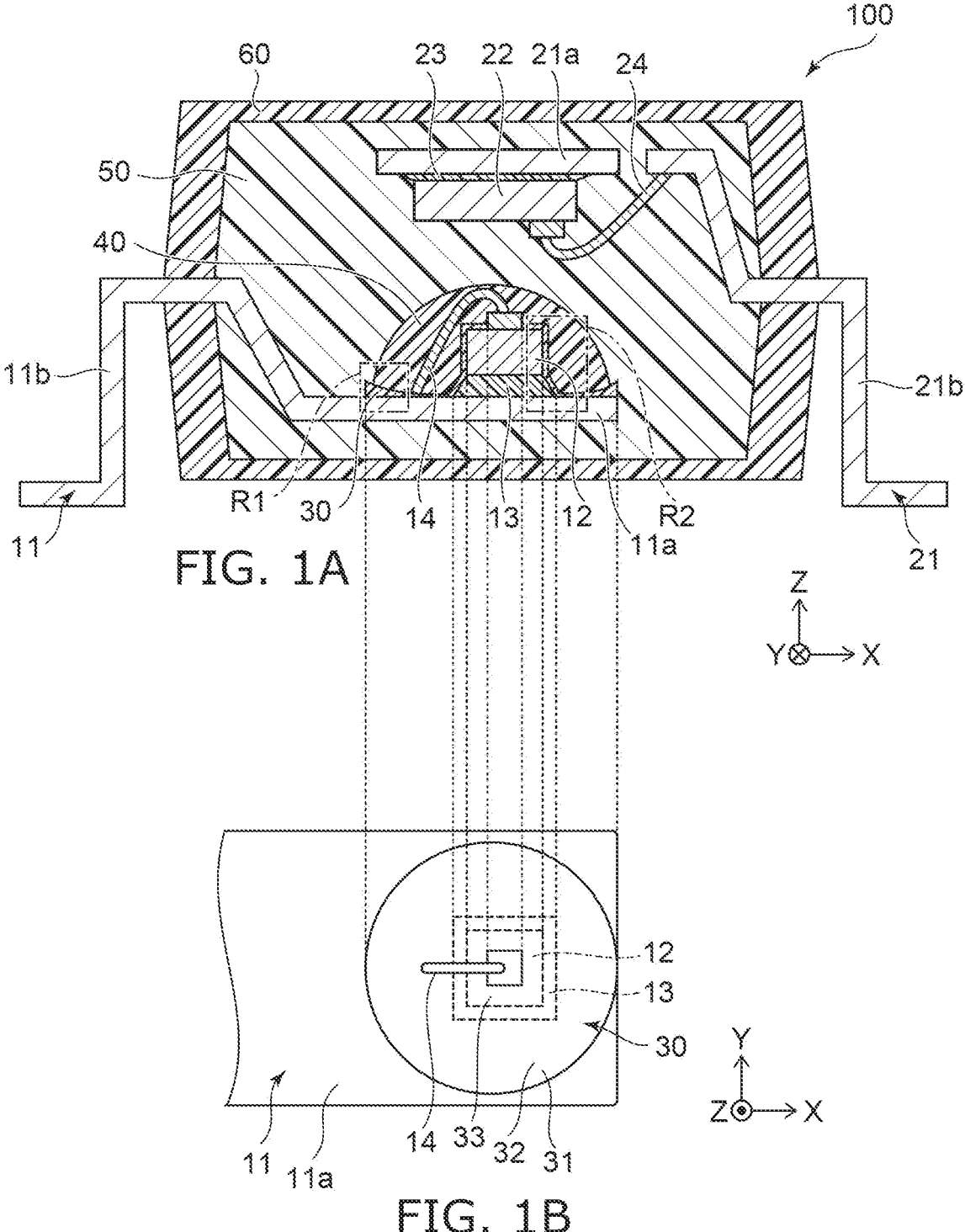
FIGS. 1A and 1B are a cross-sectional view and a plan view showing an optical coupling device according to a first embodiment.

An optical coupling device according to an embodiment includes a leadframe, a light-emitter, a light-receiver, a first resin, a second resin, a third resin, and a fourth resin. The light-emitter is located on the leadframe. The light-receiver is located at a position facing the light-emitter, and receives light generated from the light-emitter. The first resin is located on the leadframe. The first resin includes a first portion and a second portion. The first portion surrounds the light-emitter when viewed along a first direction that connects the light-emitter and the light-receiver. The second portion is positioned between the first portion and the light-emitter when viewed along the first direction. A first thickness along the first direction of the first portion is greater than a second thickness along the first direction of the second portion. The second resin is located between the light-emitter and the light-receiver in the first direction and is light-transmissive. The third resin is located between the second resin and the light-receiver in the first direction and is light-transmissive. The fourth resin houses the light-emitter, the light-receiver, the first resin, the second resin, and the third resin and is light-shielding.

Hereinafter, the embodiments of the invention will be described with reference to the drawings.

The drawings are schematic or conceptual, and the relationship between the thicknesses and widths of respective portions, the ratio of the sizes between the portions, and the like are not necessarily the same as the actual ones. Even in a case where the same portions are represented, the dimensions and the ratios of the respective portions in the drawings may be represented differently.

In the specification and the drawings, the same elements as those already described are denoted by the same reference numerals, and detailed description of the elements will be omitted as appropriate.

FIGS. 1A and 1B are a cross-sectional view and a plan view showing an optical coupling device according to a first embodiment.

As illustrated in FIGS. 1A and 1B, the optical coupling device 100 according to the first embodiment includes a first leadframe 11, a light-emitting element (a light-emitter) 12, a first adhesive layer 13, a first bonding wire 14, a second leadframe 21, a light-receiving element (a light-receiver) 22, a second adhesive layer 23, a second bonding wire 24, a first resin part (a first resin) 30, a second resin part (a second resin) 40, a third resin part (a third resin) 50, and a fourth resin part (a fourth resin) 60. Only the first leadframe 11, the light-emitting element 12, the first adhesive layer 13, the first bonding wire 14, and the first resin part 30 are illustrated in FIG. 1B.

Hereinbelow, a direction that connects the light-emitting element 12 and the light-receiving element 22 is taken as a first direction. The first direction is, for example, a Z-direction. One direction orthogonal to the first direction is taken as a second direction. The second direction is, for example, an X-direction. A direction orthogonal to the first and second directions is taken as a third direction. The third direction is, for example, a Y-direction.

The first leadframe 11 forms a terminal of the optical coupling device 100. The first leadframe 11 supports the light-emitting element 12. The first leadframe 11 includes, for example, a metal or an alloy. The first leadframe 11 includes, for example, copper. The first leadframe 11 includes, for example, an alloy that includes copper or iron. The first leadframe 11 includes a support portion 11a and a terminal portion 11b. The support portion 11a is positioned inside the fourth resin part 60. The terminal portion 11b is positioned outside the fourth resin part 60. The first leadframe 11 supports the light-emitting element 12 at the support portion 11a.

The light-emitting element 12 is located on the first leadframe 11. The light-emitting element 12 is a semiconductor element that emits light due to an electrical signal from the outside. The light-emitting element 12 is, for example, a light-emitting diode. The light-emitting element 12 may be a chip in which one package houses a substrate to which the light-emitting element is mounted and a substrate to which the peripheral circuit of the light-emitting element is mounted. The light-emitting element 12 is fixed to the support portion 11a via the first adhesive layer 13.

The first adhesive layer 13 is located between the light-emitting element 12 and the support portion 11a of the first leadframe 11 in the Z-direction and bonds the light-emitting element 12 and the support portion 11a of the first leadframe 11. The first adhesive layer 13 is, for example, a film-like adhesive or a coated film formed by coating an adhesive.

The first bonding wire 14 is wiring that electrically connects the light-emitting element 12 and the first leadframe 11. The first bonding wire 14 includes, for example, gold. One end of the first bonding wire 14 is connected to the light-emitting element 12; and the other end of the first bonding wire 14 is connected to the support portion 11a.

The second leadframe 21 forms a terminal of the optical coupling device 100. The second leadframe 21 supports the light-receiving element 22. The second leadframe 21 includes, for example, a metal or an alloy. The second leadframe 21 includes, for example, copper. The second leadframe 21 includes, for example, an alloy that includes copper or iron.

The second leadframe 21 includes a support portion 21a and a terminal portion 21b. The support portion 21a is positioned inside the fourth resin part 60. The terminal portion 21b is positioned outside the fourth resin part 60. The second leadframe 21 supports the light-receiving element 22 at the support portion 21a. The support portion 21a of the second leadframe 21 faces the support portion 11a of the first leadframe 11 in the Z-direction.

The light-receiving element 22 is located at a position facing the light-emitting element 12. The light-receiving element 22 is located on the second leadframe 21. The light-receiving element 22 is an element that receives the light generated from the light-emitting element. The light-receiving element 22 is, for example, a photodiode, a phototransistor, a light-receiving IC, etc. For example, a circuit that is connected to the light-receiving element 22 is changed on and off according to the light amount received by the light-receiving element 22. For example, the light-receiving element 22 is connected to a peripheral circuit such as a MOSFET, etc. The light-receiving element 22 is fixed to the support portion 21a via the second adhesive layer 23.

The second adhesive layer 23 is located between the light-receiving element 22 and the support portion 21a of the second leadframe 21 in the Z-direction and bonds the light-receiving element 22 and the support portion 21a of the second leadframe 21. The second adhesive layer 23 is, for example, a film-like adhesive or a coated film formed by coating an adhesive.

The second bonding wire 24 is wiring that electrically connects the light-receiving element 22 and the second leadframe 21. The second bonding wire 24 includes, for example, gold. One end of the second bonding wire 24 is connected to the light-receiving element 22; and the other end of the second bonding wire 24 is connected to the support portion 21a.

The first resin part 30 is located on the first leadframe 11. The first resin part 30 is located between the support portion 11a of the first leadframe 11 and the support portion 21a of the second leadframe 21 in the Z-direction. At least a portion of the first resin part 30 is located around the light-emitting element 12 when viewed along the Z-direction (i.e., when viewed in plan).

In the example, a portion of the first resin part 30 is located between the light-emitting element 12 and the light-receiving element 22 and between the first adhesive layer 13 and the light-receiving element 22 in the Z-direction. That is, in the example, a portion of the first resin part 30 covers the light-emitting element 12 and the first adhesive layer 13. For example, the first resin part 30 is closely adhered gaplessly to the first leadframe 11, the light-emitting element 12, and the first adhesive layer 13. The shape of the first resin part 30 is described below.

The first resin part 30 includes a resin. For example, the first resin part 30 is light-transmissive. For example, the first resin part 30 can transmit light of the same wavelength as the light generated from the light-emitting element 12. The thermal expansion coefficient of the first resin part 30 is, for example, not less than 10 ppm/K and not more than 30 ppm/K.

In one example, the first resin part 30 is an organic molecular film. In such a case, the first resin part 30 includes, for example, a resin having a molecular weight that is not less than 10,000 and not more than 100,000. The resin includes, for example, at least one selected from the group consisting of an aromatic polyamideimide resin, a polystyrene resin, a polyimide resin, and a polyamide resin.

In another example, the first resin part 30 is a molecular film that includes an inorganic filler. In such a case, the first resin part 30 includes, for example, an epoxy resin and an inorganic filler. For example, the epoxy resin is light-transmissive. The thermal expansion coefficient of the epoxy resin is, for example, not less than 30 ppm/K and not more than 100 ppm/K. For example, the inorganic filler is silica-based. For example, the inorganic filler is light-transmissive. The particle size of the inorganic filler is, for example, not less than 0.1 μm and not more than 15 μm, and favorably not less than 0.1 μm and not more than 10 μm. The thermal expansion coefficient of the inorganic filler is, for example, not less than 0.3 ppm/K and not more than 2 ppm/K.

The second resin part 40 is located between the light-emitting element 12 and the light-receiving element 22 in the Z-direction. The second resin part 40 is a so-called encapsulation resin. In the example, the second resin part 40 is located between the first resin part 30 and the light-receiving element 22 in the Z-direction. For example, the second resin part 40 covers the light-emitting element 12, the first adhesive layer 13, the first bonding wire 14, and the first resin part 30. For example, the second resin part 40 is closely adhered gaplessly to the first bonding wire 14 and the first resin part 30. For example, the second resin part 40 is formed in a dome shape.

The second resin part 40 includes a resin. The second resin part 40 is light-transmissive. For example, the second resin part 40 can transmit light of the same wavelength as the light generated from the light-emitting element 12. The second resin part 40 includes, for example, a light-transmissive epoxy resin and light-transmissive silicone.

The third resin part 50 is located between the second resin part 40 and the light-receiving element 22 in the Z-direction. The third resin part 50 is a so-called inner resin. For example, the third resin part 50 is filled into the space inside the fourth resin part 60 where the first leadframe 11, the light-emitting element 12, the first adhesive layer 13, the first bonding wire 14, the second leadframe 21, the light-receiving element 22, the second adhesive layer 23, the second bonding wire 24, the first resin part 30, and the second resin part 40 are not located. For example, the third resin part 50 is closely adhered gaplessly to the first leadframe 11, the second leadframe 21, the light-receiving element 22, the second adhesive layer 23, the second bonding wire 24, the first resin part 30, and the second resin part 40.

The third resin part 50 includes a resin. The third resin part 50 is light-transmissive. For example, the third resin part 50 can transmit light of the same wavelength as the light generated from the light-emitting element 12. The third resin part 50 includes, for example, a light-transmissive epoxy resin and a light-transmissive inorganic filler.

For example, the first resin part 30, the second resin part 40, and the third resin part 50 can transmit the light generated from the light-emitting element 12. Therefore, the space between the light-emitting element 12 and the light-receiving element 22 can be filled with the first resin part 30, the second resin part 40, and the third resin part 50 without obstructing the light-receiving element 22 receiving the light generated from the light-emitting element 12; and the reliability can be increased.

The fourth resin part 60 is an exterior material of the optical coupling device 100. The fourth resin part 60 is a so-called outer resin. The support portion 11a of the first leadframe 11, the light-emitting element 12, the first adhesive layer 13, the first bonding wire 14, the support portion 21a of the second leadframe 21, the light-receiving element 22, the second adhesive layer 23, the second bonding wire 24, the first resin part 30, the second resin part 40, and the third resin part 50 are housed inside the fourth resin part 60. For example, the fourth resin part 60 is closely adhered gaplessly to the first leadframe 11, the second leadframe 21, and the third resin part 50.

The fourth resin part 60 includes a resin. The fourth resin part 60 is light-shielding. For example, the fourth resin part 60 can shield light of the same wavelength as the light generated from the light-emitting element 12. For example, the fourth resin part 60 is opaque. The fourth resin part 60 includes, for example, an epoxy resin and a light-shielding inorganic filler.

The fourth resin part 60 prevents light from outside the fourth resin part 60 from reaching the interior of the fourth resin part 60. In other words, the fourth resin part 60 shields the outside light. Thereby, the fourth resin part 60 prevents the light-receiving element 22 from receiving light from the outside.

In this specification, "light-transmissive" means that light is easily transmitted. In this specification, "light-shielding" means that light is not easily transmitted. That is, the light transmittance of a light-transmissive object is greater than the light transmittance of a light-shielding object. The light transmittance of the first resin part 30 is, for example, greater than the light transmittance of the fourth resin part 60. The light transmittance of the second resin part 40 is, for example, greater than the light transmittance of the fourth resin part 60. The light transmittance of the third resin part 50 is, for example, greater than the light transmittance of the fourth resin part 60.

The shape of the first resin part 30 will now be described in more detail.

Figure 2A:
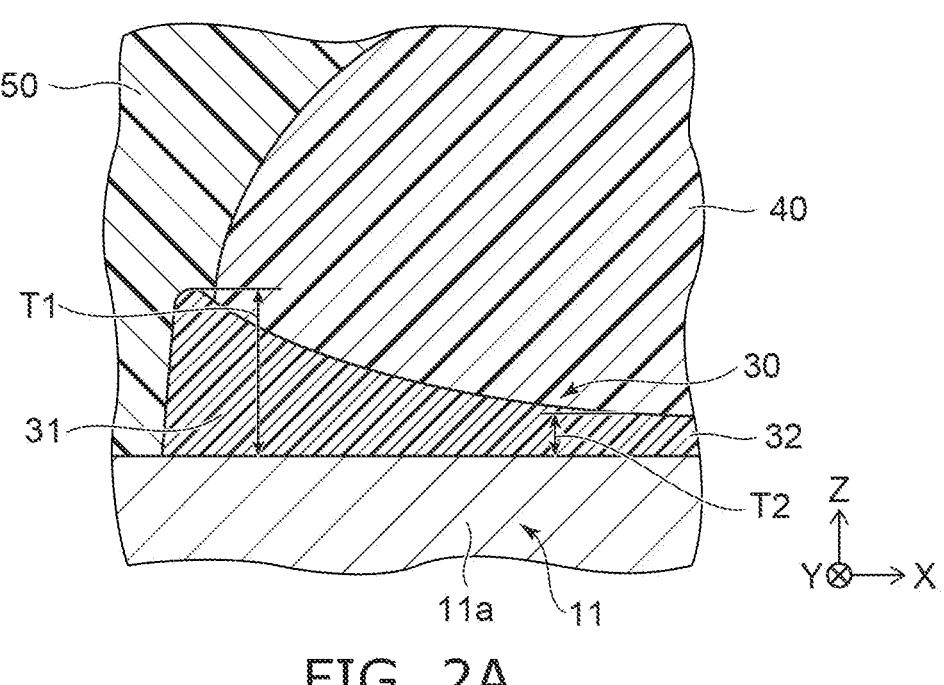
FIGS. 2A and 2B are cross-sectional views showing a portion of the optical coupling device according to the first embodiment.
Figure 2B:
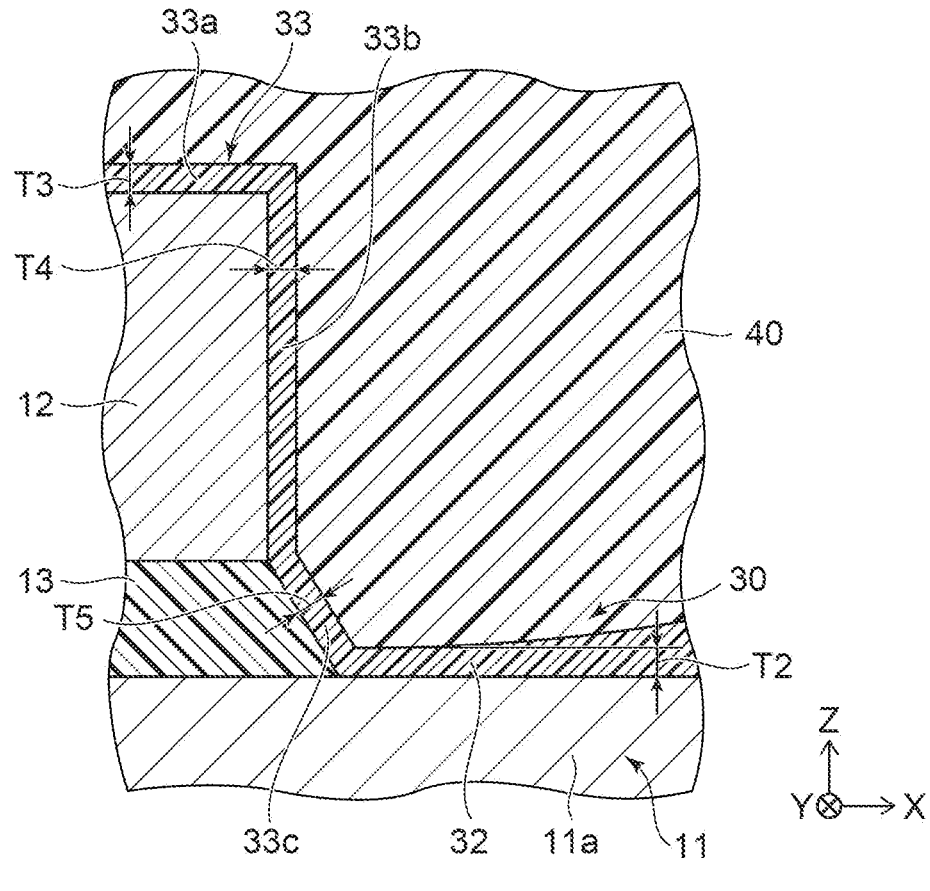

FIGS. 2A and 2B are cross-sectional views showing a portion of the optical coupling device according to the first embodiment.

FIG. 2A is an enlarged view of region R1 shown in FIG. 1A.

FIG. 2B is an enlarged view of region R2 shown in FIG. 1A.

As illustrated in FIG. 2A, the first resin part 30 includes a first portion 31 and a second portion 32.

The first portion 31 surrounds the light-emitting element 12 when viewed along the Z-direction (i.e., when viewed in plan). When the light-emitting element 12 is taken to be at the center, the first portion 31 surrounds the outer side of the light-emitting element 12. In other words, the light-emitting element 12 is positioned inside a region surrounded with the first portion 31. The first portion 31 is positioned at the outer perimeter end portion of the first resin part 30. For example, the first portion 31 is provided in a ring shape to surround the light-emitting element 12. For example, the first portion 31 does not overlap the light-emitting element 12 in the Z-direction.

The second portion 32 is positioned between the first portion 31 and the light-emitting element 12 when viewed along the Z-direction. When the light-emitting element 12 is taken to be at the center, the second portion 32 surrounds the outer side of the light-emitting element 12 and is surrounded with the first portion 31. In other words, the second portion 32 is positioned inside a region surrounded with the first portion 31; and the light-emitting element 12 is positioned inside a region surrounded with the second portion 32. The second portion 32 is positioned inward of the outer perimeter end portion of the first resin part 30. For example, the second portion 32 is provided in a ring shape to surround the light-emitting element 12 further inward than the first portion 31. For example, the second portion 32 does not overlap the light-emitting element 12 in the Z-direction.

The length along the Z-direction of the first portion 31 is taken as a first thickness T1. The length along the Z-direction of the second portion 32 is taken as a second thickness T2. The first thickness T1 is greater than the second thickness T2. That is, the first resin part 30 has a concave configuration in which the thickness of the outer perimeter end portion is greater than the thickness of the portion (the central portion) further inward than the outer perimeter end portion. For example, the thickness of the first resin part 30 continuously decreases from the outer side toward the interior. The first thickness T1 is, for example, the maximum thickness of the first portion 31. The second thickness T2 is, for example, the minimum thickness of the second portion 32.

The first thickness T1 is, for example, not less than 1 μm and not more than 35 μm. The second thickness T2 is, for example, not less than 0.1 μm and not more than 20 μm. It is favorable for the difference (T2–T1) between the second thickness T2 and the first thickness T1 to be not less than 0.1 μm.

In the example as illustrated in FIG. 2B, the first resin part 30 further includes a third portion 33. The third portion 33 overlaps at least one of the light-emitting element 12 or the first adhesive layer 13 in the Z-direction. The third portion 33 is provided as necessary and is omissible. That is, the first resin part 30 may cover the light-emitting element 12 and the first adhesive layer 13; or, the light-emitting element 12 and the first adhesive layer 13 may not be covered.

The third portion 33 includes a first region 33a, a second region 33b, and a third region 33c. The first region 33a overlaps the light-emitting element 12 in the Z-direction. The first region 33a does not overlap the light-emitting element 12 in the X-direction. The second region 33b and the third region 33c overlap the first adhesive layer 13 in the Z-direction. The second region 33b overlaps the light-emitting element 12 in the X-direction. The third region 33c overlaps the first adhesive layer 13 in the X-direction.

The length of the first region 33a along a direction (e.g., the Z-direction) orthogonal to the bonding surface with the light-emitting element 12 is taken as a third thickness T3. The length of the second region 33b along a direction (e.g., the X-direction) orthogonal to the bonding surface with the light-emitting element 12 is taken as a fourth thickness T4. The length of the third region 33c along a direction orthogonal to the bonding surface with the first adhesive layer 13 is taken as a fifth thickness T5. For example, the third thickness T3, the fourth thickness T4, and the fifth thickness T5 are equal. For example, the third thickness T3, the fourth thickness T4, and the fifth thickness T5 each are equal to the second thickness T2 or less than the second thickness T2.

For example, the third thickness T3, the fourth thickness T4, and the fifth thickness T5 each are not less than 0.5 μm and not more than 20 μm.

In the example, in the X-direction, the first portion 31 and the second portion 32 overlap the first adhesive layer 13 but do not overlap the light-emitting element 12. That is, when the second leadframe 21 side is taken as up and the first leadframe 11 side is taken as down, the upper end of the first portion 31 is positioned lower than the lower end of the light-emitting element 12. The first portion 31 and the second portion 32 may overlap the light-emitting element 12 in the X-direction. That is, the upper end of the first portion 31 may be positioned higher than the lower end of the light-emitting element 12. However, it is favorable for the upper end of the first portion 31 to be positioned lower than the upper end of the light-emitting element 12.

Effects of the optical coupling device according to the embodiment will now be described.

In the optical coupling device, the light-emitting element that is located on the leadframe is covered with an encapsulation resin such as a silicone resin, etc. Thus, by covering the light-emitting element with the encapsulation resin, the light-emitting element can be protected from external stress and impurities; and the reliability of the optical coupling device can be increased. However, when the light-emitting element is located on a flat leadframe, it is difficult to form the encapsulation resin in a dome shape that covers the entire light-emitting element chip. Also, when the encapsulation resin wets and spreads when being formed, there is a risk that the adhesion between the encapsulation resin and the leadframe may degrade.

As a technique to solve such a problem, it may be considered to provide a recess in the leadframe by stamping or the like, dispose the light-emitting element in the recess, and cover the light-emitting element with an encapsulation resin. However, when the leadframe includes copper, and the recess is formed in the leadframe by stamping, this configuration may result in the elution of copper and/or impurities. Also, there is a risk that clamping defects and the like may occur in the wire bonding process. Therefore, in the optical coupling device, it is desirable to increase the reliability by suppressing the wetting and spreading of the encapsulation resin without stamping.

According to the embodiment, because the first resin part 30 is located on the first leadframe 11, and because the first thickness T1 of the first portion 31 positioned at the outer side of the first resin part 30 is set to be greater than the second thickness T2 of the second portion 32 positioned inward of the first portion 31, a concave structure that is thin at the central portion and thick at the outer perimeter end portion can be formed on the first leadframe 11. Therefore, the wetting and spreading of the second resin part 40 (the encapsulation resin) can be suppressed without stamping. Accordingly, the reliability can be increased.

According to the embodiment, because at least a portion of the first resin part 30 overlaps the light-emitting element 12 in the Z-direction, the first resin part 30 can be easily formed because the composition solution can be coated without needing to avoid the light-emitting element 12 when forming the first resin part 30. Also, because the first resin part 30 is light-transmissive, shielding of the light generated from the light-emitting element 12 by the first resin part 30 can be suppressed even when the first resin part 30 overlaps the light-emitting element 12.

According to the embodiment, the wetting and spreading of the second resin part 40 (the encapsulation resin) can be more reliably suppressed by setting the first thickness T1 to be not less than 1 μm and not more than 35 μm and the second thickness T2 to be not less than 0.1 μm and not more than 20 μm. Also, the wetting and spreading of the second resin part 40 (the encapsulation resin) can be more reliably suppressed by setting the difference between the second thickness T2 and the first thickness T1 to be not less than 0.1 μm.

According to the embodiment, the reliability of the package can be increased by setting the thermal expansion coefficient of the first resin part 30 to be not less than 10 ppm/K and not more than 30 ppm/K.

According to the embodiment, the first resin part 30 includes a resin having a molecular weight that is not less than 10,000 and not more than 100,000; and the resin includes at least one selected from the group consisting of an aromatic polyamideimide resin, a polystyrene resin, a polyimide resin, and a polyamide resin; the reliability of the package can be increased thereby.

According to the embodiment, the first resin part 30 includes an epoxy resin that is light-transmissive and has a thermal expansion coefficient that is not less than 30 ppm/K and not more than 100 ppm/K, and an inorganic filler that is silica-based, is light-transmissive, has a thermal expansion coefficient that is not less than 0.3 ppm/K and not more than 2 ppm/K, and has a particle size that is not less than 0.1 μm and not more than 15 μm; the thermal expansion coefficient of the first resin part 30 can be easily adjusted thereby. The reliability of the entire package can be increased by reducing the thermal expansion coefficient difference with the other resin parts.

According to the embodiment, because the second resin part 40 includes the light-transmissive epoxy resin and light-transmissive silicone, the stress from the outside can be relaxed, the light-emitting element 12 that is located in the interior can be protected, and the reliability of the entire package can be increased.

According to the embodiment, because the third resin part 50 includes a light-transmissive epoxy resin and a light-transmissive inorganic filler, the light-receiving element 22 can more reliably receive the light generated from the light-emitting element 12.

According to the embodiment, because the fourth resin part 60 includes an epoxy resin and a light-shielding inorganic filler, the light-receiving element 22 can be more reliably prevented from receiving light from the outside; the heat and the stress from the outside can be relaxed; and the light-emitting element 12 and the light-receiving element 22 that are located in the interior can be protected.

According to the embodiment, the protection effect of the light-emitting element 12 can be improved by employing a flexible molecular film as the first resin part 30. For example, the protection effect of the light-emitting element 12 can be improved by employing a molecular film as the first resin part 30 that has a tensile elasticity that is not more than 4 GPa.

According to the embodiment, compared to when the first resin part 30 is not included, the gap between the second resin part 40 and the third resin part 50 can be reduced by providing the first resin part 30.

Second Embodiment

Figures 3A, 3B:
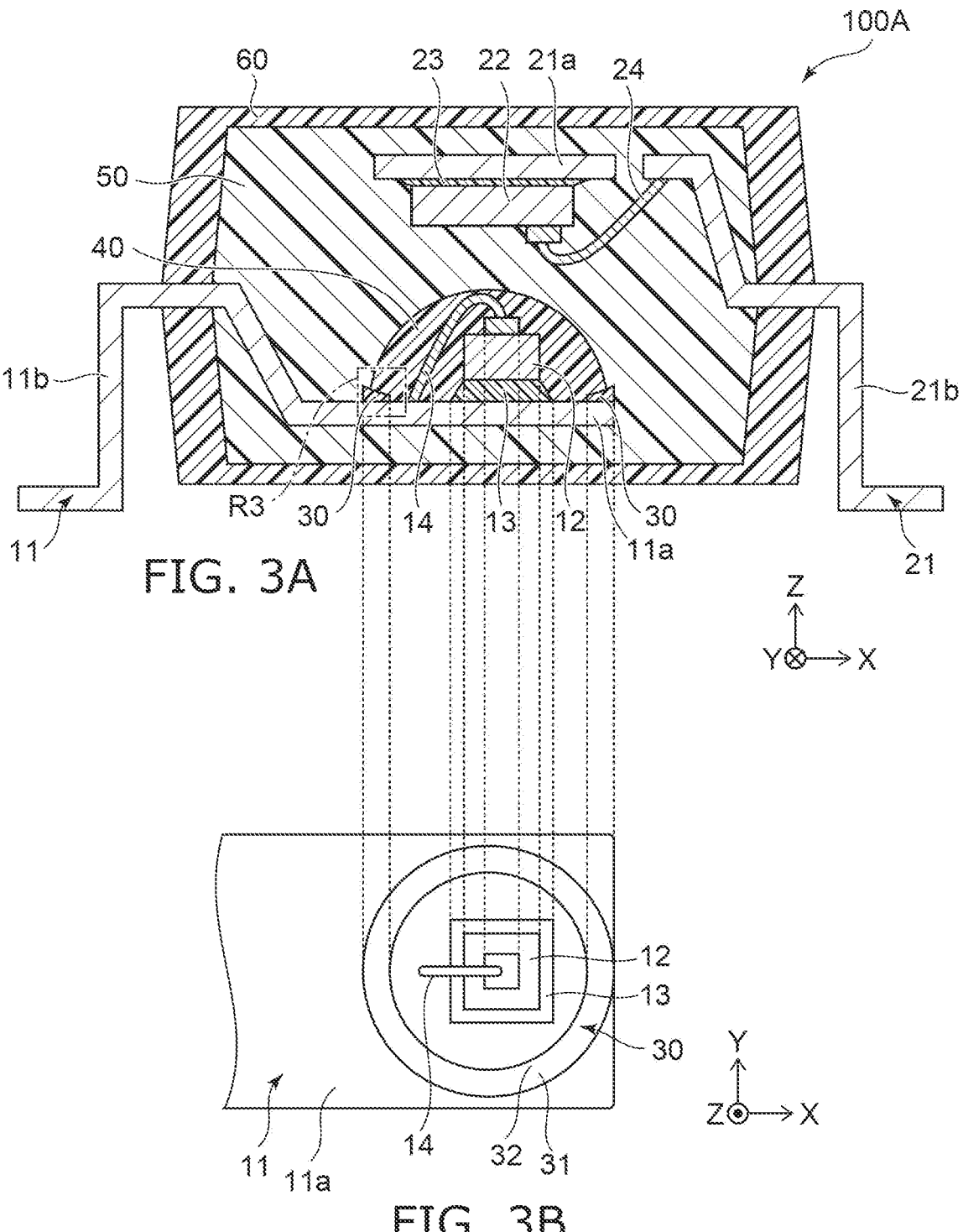
FIGS. 3A and 3B are a cross-sectional view and a plan view showing an optical coupling device according to a second embodiment.

FIGS. 3A and 3B are a cross-sectional view and a plan view showing an optical coupling device according to a second embodiment.

Figure 4:
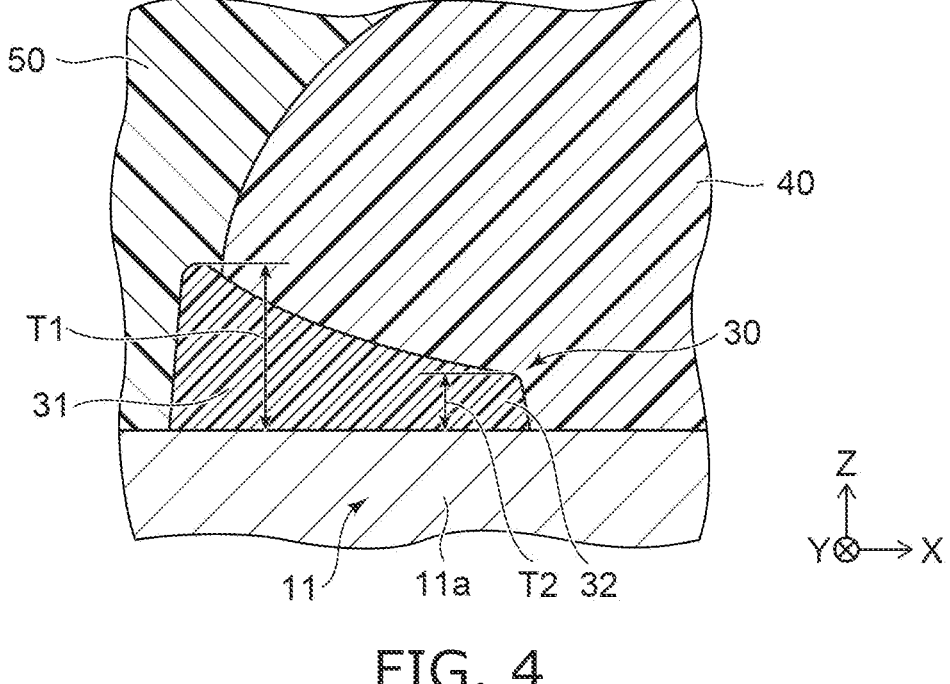
FIG. 4 is a cross-sectional view showing a portion of the optical coupling device according to the second embodiment.

FIG. 4 is a cross-sectional view showing a portion of the optical coupling device according to the second embodiment.

Only the first leadframe 11, the light-emitting element 12, the first adhesive layer 13, the first bonding wire 14, and the first resin part 30 are illustrated in FIG. 3B.

FIG. 4 is an enlarged view of region R3 shown in FIG. 3A.

As illustrated in FIGS. 3A and 3B, the third portion 33 of the first resin part 30 is not included in the optical coupling device 100A according to the second embodiment. That is, in the example, the first resin part 30 has a ring shape that surrounds the outer side of the light-emitting element 12. Other than not including the third portion 33 of the first resin part 30, the optical coupling device 100A according to the second embodiment is substantially the same as the optical coupling device 100 according to the first embodiment.

As illustrated in FIG. 4, in the optical coupling device 100A according to the second embodiment as well, the first resin part 30 includes the first portion 31 and the second portion 32. The first thickness T1 of the first portion 31 is greater than the second thickness T2 of the second portion 32. The first thickness T1 is, for example, not less than 1 μm and not more than 35 μm. The second thickness T2 is, for example, not less than 0.1 μm and not more than 20 μm.

In the example as well, in the X-direction, the first portion 31 and the second portion 32 overlap the first adhesive layer 13 but do not overlap the light-emitting element 12. That is, when the second leadframe 21 side is taken as up and the first leadframe 11 side is taken as down, the upper end of the first portion 31 is positioned lower than the lower end of the light-emitting element 12. The first portion 31 and the second portion 32 may overlap the light-emitting element 12 in the X-direction. That is, the upper end of the first portion 31 may be positioned higher than the lower end of the light-emitting element 12. However, it is favorable for the upper end of the first portion 31 to be positioned lower than the upper end of the light-emitting element 12.

According to the second embodiment as well, a concave structure that is thin at the central portion and thick at the outer perimeter end portion can be formed on the first leadframe 11 by providing the first resin part 30 on the first leadframe 11 and by setting the first thickness T1 of the first portion 31 positioned at the outer side of the first resin part 30 to be greater than the second thickness T2 of the second portion 32 positioned inward of the first portion 31. Thereby, wetting and spreading of the second resin part 40 (the encapsulation resin) can be suppressed without stamping. Accordingly, the reliability can be increased.

In the optical coupling device 100A according to the second embodiment, the first resin part 30 does not cover the light-emitting element 12. Therefore, according to the second embodiment, the first resin part 30 may not be light-transmissive. That is, according to the second embodiment, the first resin part 30 may be light-shielding.

Third Embodiment

Figures 5A, 5B:
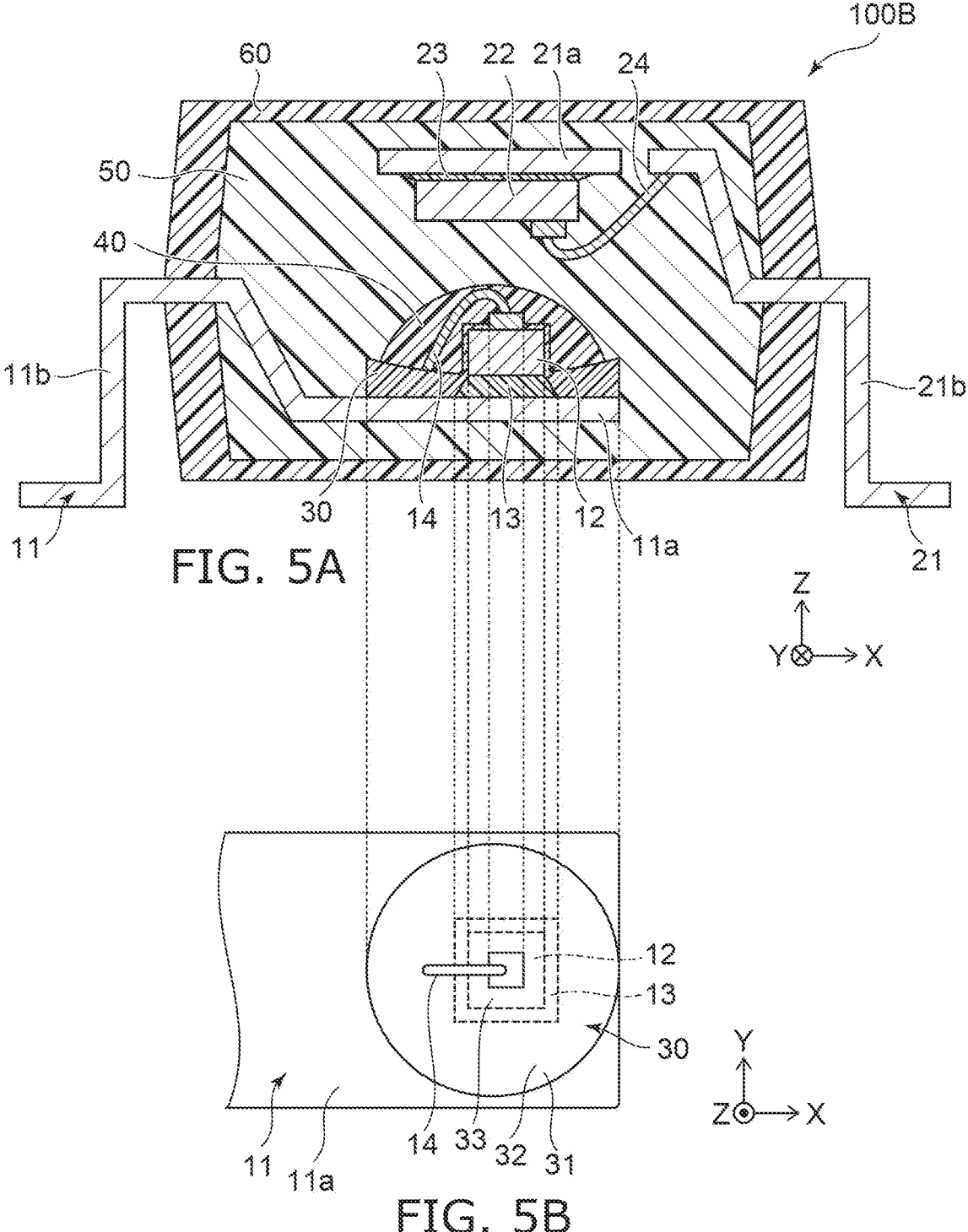
FIGS. 5A and 5B are a cross-sectional view and a plan view showing an optical coupling device according to a third embodiment.

FIGS. 5A and 5B are a cross-sectional view and a plan view showing an optical coupling device according to a third embodiment.

Only the first leadframe 11, the light-emitting element 12, the first adhesive layer 13, the first bonding wire 14, and the first resin part 30 are illustrated in FIG. 5B.

As illustrated in FIGS. 5A and 5B, compared to the optical coupling device 100 according to the first embodiment, the thickness of the first resin part 30 is thick in the optical coupling device 100B according to the third embodiment. Other than the thickness of the first resin part 30 being thick, the optical coupling device 100B according to the third embodiment is substantially the same as the optical coupling device 100 according to the first embodiment.

In the optical coupling device 100B according to the third embodiment as well, the first resin part 30 includes the first portion 31, the second portion 32, and the third portion 33. The first thickness T1 of the first portion 31 is greater than the second thickness T2 of the second portion 32. In the example, the first thickness T1 is, for example, not less than 10 μm and not more than 100 μm. The second thickness T2 is, for example, not less than 5 μm and not more than 85 μm.

In the example, in the X-direction, the first portion 31 and the second portion 32 overlap the first adhesive layer 13 and the light-emitting element 12. That is, when the second leadframe 21 side is taken as up and the first leadframe 11 side is taken as down, the upper end of the first portion 31 is positioned higher than the lower end of the light-emitting element 12. It is favorable for the upper end of the first portion 31 to be positioned lower than the upper end of the light-emitting element 12. As described above, the first portion 31 and the second portion 32 may not overlap the light-emitting element 12 in the X-direction. That is, the upper end of the first portion 31 may be positioned lower than the lower end of the light-emitting element 12.

According to the third embodiment as well, because the first resin part 30 is located on the first leadframe 11 and the first thickness T1 of the first portion 31 positioned at the outer side of the first resin part 30 is set to be greater than the second thickness T2 of the second portion 32 positioned inward of the first portion 31, a concave structure that is thin at the central portion and thick at the outer perimeter end portion can be formed on the first leadframe 11. Thereby, wetting and spreading of the second resin part 40 (the encapsulation resin) can be suppressed without stamping. Accordingly, the reliability can be increased.

According to the embodiment, by setting the first thickness T1 to be not less than 10 μm and not more than 100 μm and the second thickness T2 to be not less than 5 μm and not more than 85 m, the light-emitting element 12 can be easily protected, and the reliability can be increased. Compared to when the first thickness T1 and the second thickness T2 are small, the size of the second resin part 40 can be reduced by thus increasing the first thickness T1 and the second thickness T2. Compared to when the size of the second resin part 40 is large, the contraction amount when cooling in the formation of the second resin part 40 can be reduced by reducing the size of the second resin part 40. The gap that occurs between the second resin part 40 and the third resin part 50 due to the contraction can be reduced thereby (e.g., to be not more than 0.1 μm); and the penetration of moisture, resin cracks, corrosion, etc., can be suppressed. The adhesion between the first resin part 30 and the third resin part 50 can be improved by increasing the first thickness T1 and the second thickness T2. The popcorn phenomenon can be suppressed thereby; the stress on the light-emitting element 12 and the first adhesive layer 13 due to the deformation of the second resin part 40 can be absorbed; and the degradation can be suppressed.

A method for manufacturing the optical coupling device according to the embodiment will now be described.

According to the method for manufacturing the optical coupling device according to the embodiment, first, the light-emitting element 12 is bonded to the first leadframe 11 via the first adhesive layer 13; and the first leadframe 11 and the light-emitting element 12 are connected by the first bonding wire 14. Similarly, the light-receiving element 22 is bonded to the second leadframe 21 via the second adhesive layer 23; and the second leadframe 21 and the light-receiving element 22 are connected by the second bonding wire 24.

Then, according to the method for manufacturing the optical coupling device according to the embodiment, the first resin part 30 is formed by coating a first composition solution that has a coffee ring effect on the first leadframe 11 and by drying. A molecular film that has a concave structure that is thin at the central portion and thick at the outer perimeter end portion is formed thereby. The first resin part 30 that includes the first and second portions 31 and 32 is formed thereby. At this time, the third portion 33 can be formed by coating the first composition solution from above the light-emitting element 12 and the first adhesive layer 13. Or, the formation of the third portion 33 can be omitted at this time by coating a composition solution to avoid the light-emitting element 12 and the first adhesive layer 13.

The "coffee ring effect" is the property of a dispersion liquid (a composition solution) in which a dispersoid is dispersed in a dispersion medium, and due to the evaporation rate difference between the central portion and the outer perimeter end portion of the droplet when the dispersion medium evaporates, more of the dispersoid is deposited at the outer perimeter end portion than at the central portion. By coating and drying a composition solution that has the coffee ring effect, a film that has a concave structure that is thin at the central portion and thick at the outer perimeter end portion can be easily formed.

In one example, the first composition solution includes a solvent and a resin having a molecular weight that is not less than 10,000 and not more than 100,000. The resin includes, for example, at least one selected from the group consisting of an aromatic polyamideimide resin, a polystyrene resin, a polyimide resin, and a polyimide resin. It is sufficient for the solvent to be capable of uniformly dispersing the resin.

In another example, the first composition solution includes an epoxy resin, an inorganic filler, and a solvent. For example, the epoxy resin is light-transmissive. The thermal expansion coefficient of the epoxy resin is, for example, not less than 30 ppm/K and not more than 100 ppm/K. For example, the inorganic filler is silica-based. For example, the inorganic filler is light-transmissive. The particle size of the inorganic filler is, for example, not less than 0.1 μm and not more than 15 μm. The thermal expansion coefficient of the inorganic filler is not less than 0.3 ppm/K and not more than 2 ppm/K. It is sufficient for the solvent to be capable of uniformly dispersing the epoxy resin and the inorganic filler.

It is favorable for the contact angle hysteresis of the first composition solution to be not less than 5°. It is favorable for the viscosity of the first composition solution to be not more than 300 mPa·s. It is favorable for the solid component concentration of the first composition solution to be not less than 0.05 mass % and not more than 30 mass %, and more favorably not less than 3 mass % and not more than 30 mass %. The coffee ring effect easily occurs in a first composition solution that satisfies at least one of these criteria. In particular, the difference between the first thickness T1 and the second thickness T2 is easily increased when the contact angle hysteresis of the first composition solution is not less than 5°.

The thicknesses of the components of the first resin part 30 that is formed (the first thickness T1, the second thickness T2, etc.) can be adjusted using the molecular shape of the resin included in the first composition solution, the size of the resin, the volume fraction of the first composition solution, the pH of the first composition solution, etc.

Then, according to the method for manufacturing the optical coupling device according to the embodiment, the second resin part 40 is formed by coating a second composition solution inward of the first portion 31 of the first resin part 30 and by drying. The wetting and spreading of the second composition solution is suppressed at this time by providing the first portion 31. The second composition solution includes, for example, a light-transmissive epoxy resin, light-transmissive silicone, and a solvent. It is sufficient for the solvent to be capable of uniformly dispersing the epoxy resin and the silicone.

Continuing according to the method for manufacturing the optical coupling device according to the embodiment, the third resin part 50 is formed by molding and curing a resin tablet of a third composition. The third composition includes, for example, a light-transmissive epoxy resin, a light-transmissive inorganic filler, and a solvent. It is sufficient for the solvent to be capable of uniformly dispersing the epoxy resin and the inorganic filler.

Then, according to the method for manufacturing the optical coupling device according to the embodiment, the fourth resin part 60 is formed by molding and curing a resin tablet of a fourth composition. The fourth composition includes, for example, an epoxy resin, a light-shielding inorganic filler, and a solvent. It is sufficient for the solvent to be capable of uniformly dispersing the epoxy resin and the inorganic filler.

Thus, according to embodiments of the invention, the optical coupling device is provided in which the reliability can be increased.

While certain embodiments of the invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such embodiments or variations as would fall within the scope and spirit of the inventions. In addition, each of the above-described embodiments can be implemented in a combination of the embodiments.

What is claimed is:

1. An optical coupling device, comprising:
   a leadframe;
   a light-emitter located on the leadframe;
   a light-receiver located at a position facing the light-emitter, the light-receiver receiving light generated from the light-emitter;
   a first resin located on the leadframe, the first resin including
      a first portion surrounding the light-emitter when viewed along a first direction, the first direction connecting the light-emitter and the light-receiver, and
      a second portion positioned between the first portion and the light-emitter when viewed along the first direction, a first thickness along the first direction of the first portion being greater than a second thickness along the first direction of the second portion, wherein the first thickness is not less than 1 μm and not more than 35 μm, and wherein the second thickness is not less than 0.1 μm and not more than 20 μm;
   a second resin located between the light-emitter and the light-receiver in the first direction, the second resin being light-transmissive;

a third resin located between the second resin and the light-receiver in the first direction, the third resin being light-transmissive; and a fourth resin housing the light-emitter, the light-receiver, the first resin, the second resin, and the third resin, the fourth resin being light-shielding, the first portion being provided in a ring shape when viewed along the first direction, an outer perimeter end portion of the second resin being surrounded by the first portion when viewed along the first direction, the third resin contacting the second resin and the leadframe.

2. The device according to claim 1, wherein the first resin is light-transmissive, and at least a portion of the first resin overlaps the light-emitter in the first direction.

3. The device according to claim 1, wherein a thermal expansion coefficient of the first resin is not less than 10 ppm/K and not more than 30 ppm/K.

4. The device according to claim 1, wherein the first resin includes a resin having a molecular weight of not less than 10,000 and not more than 100,000, and the first resin includes at least one selected from the group consisting of an aromatic polyamideimide resin, a polystyrene resin, a polyimide resin, and a polyamide resin.

5. The device according to claim 1, wherein the first resin includes:

an epoxy resin that is light-transmissive and has a thermal expansion coefficient of not less than 30 ppm/K and not more than 100 ppm/K; and an inorganic filler that is silica-based, is light-transmissive, has a thermal expansion coefficient of not less than 0.3 ppm/K and not more than 2 ppm/K, and has a particle size of not less than 0.1 μm and not more than 15 μm.

6. The device according to claim 1, wherein the second resin includes:

an epoxy resin that is light-transmissive; and silicone that is light-transmissive, the third resin includes:

an epoxy resin that is light-transmissive; and an inorganic filler that is light-transmissive, and the fourth resin includes:

an epoxy resin; and an inorganic filler that is light-shielding.

7. The device according to claim 1, wherein the third resin surrounds the second resin and the leadframe.

8. The device according to claim 1, wherein the second resin is provided in a dome shape.

9. The device according to claim 1, further comprising a bonding wire electrically connecting the light-emitter and the first leadframe, wherein the first resin contacts an upper surface and a side surface of the light-emitter, and the second resin contacts the bonding wire.

10. The device according to claim 1, wherein the first resin is interposed between the second resin and the leadframe such that the second resin is not in direct contact with the leadframe.

*   *   *   *   *